(12) United States Patent
Li et al.

(10) Patent No.: US 7,568,518 B2
(45) Date of Patent: Aug. 4, 2009

(54) HEAT SINK

(75) Inventors: Zhi-Jian Li, Shenzhen (CN); Ching-Bai Hwang, Tu-Cheng (TW)

(73) Assignees: Furui Precise Component (Kunshan) Co., Ltd., KunShan (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 292 days.

(21) Appl. No.: 11/309,291

(22) Filed: Jul. 21, 2006

(65) Prior Publication Data

US 2008/0017349 A1    Jan. 24, 2008

(51) Int. Cl.
*F28F 7/00* (2006.01)
*H05K 7/20* (2006.01)

(52) U.S. Cl. .................... 165/80.3; 165/104.21
(58) Field of Classification Search ............... 165/80.3, 165/185, 104.21, 104.33, 104.34; 361/699, 361/700; 257/715; 174/15.2, 16.3
See application file for complete search history.

(56) References Cited

U.S. PATENT DOCUMENTS

| 2,804,286 | A | * | 8/1957 | Pintarelli | .................... 165/182 |
| 4,984,626 | A | | 1/1991 | Esformes et al. | |
| 5,794,684 | A | | 8/1998 | Jacoby | |
| 5,887,649 | A | * | 3/1999 | Kim | ............................ 165/151 |
| 6,741,468 | B2 | | 5/2004 | Jing et al. | |
| 6,914,780 | B1 | * | 7/2005 | Shanker et al. | .............. 361/687 |
| 6,976,529 | B2 | | 12/2005 | Kester | |
| 7,021,370 | B2 | * | 4/2006 | Papapanu et al. | ........... 165/151 |
| 2003/0024687 | A1 | * | 2/2003 | Cheng et al. | ................ 165/80.3 |
| 2003/0155104 | A1 | * | 8/2003 | Wenger et al. | ............. 165/80.3 |
| 2004/0017659 | A1 | * | 1/2004 | Jing et al. | .................... 361/700 |
| 2004/0200608 | A1 | * | 10/2004 | Baldassarre | ................. 165/181 |
| 2005/0190538 | A1 | * | 9/2005 | Huang | ......................... 361/697 |
| 2007/0119566 | A1 | * | 5/2007 | Peng | ......................... 165/80.3 |
| 2007/0188992 | A1 | * | 8/2007 | Hwang et al. | ............... 361/700 |

FOREIGN PATENT DOCUMENTS

| JP | 60194293 | A | * | 10/1985 |
| JP | 62206384 | A | * | 9/1987 |
| JP | 02068499 | A | * | 3/1990 |
| TW | 200537278 | | | 11/2005 |

\* cited by examiner

*Primary Examiner*—Tho v Duong
(74) *Attorney, Agent, or Firm*—Frank R. Niranjan

(57) ABSTRACT

A heat sink includes a fin unit (10) having a plurality of fins (20) parallel to each other. A flow channel (21) is formed between any of two neighboring fins for an airflow flowing therethough. Three protrusions (26, 27, 28) are arranged on each of the fins and each define a through hole (42) therein. The through hole communicates with two neighboring flow channels of the fin for the airflow flowing therethrough from one of the two neighboring flow channels to the other one of two neighboring flow channels of the fin.

2 Claims, 10 Drawing Sheets es 1
HEAT SINK

DESCRIPTION

FIELD OF THE INVENTION

The present invention relates generally to a heat sink, and in particular to a heat sink with improved fin structure for achieving a high heat-dissipation efficiency.

DESCRIPTION OF RELATED ART

With the advance of large scale integrated circuit technology, high speed processors have become faster and faster, which causes the processors to generate more redundant heat. Redundant heat which is not quickly removed will have tremendous influence on the system security and performance. Usually, people install a heat sink on the central processor to assist its heat dissipation, whilst also installing a fan on the heat sink, to provide a forced airflow to increase heat dissipation.

FIG. 10 shows a heat sink 1 in accordance with related art. The heat sink 1 comprises a fin unit 2, a heat pipe 4 extending through the fin unit 2, and a cooling fan (not shown) arranged at a side of the fin unit 2 so as to generate an airflow flowing through the fin unit 2. The fin unit 2 comprises a plurality of fins stacked together. Each fin is planar and parallel to each other. A flow channel 3 is formed between two adjacent fins. The heat pipe 4 includes an evaporating section for thermally connecting with a heat-generating electronic device and condensing sections extending into through holes of the fin unit 2 and thermally connecting with the fins.

During operation of the heat-generating electronic device the heat pipe 4 absorbs heat generated by the heat-generating electronic device. The heat is moved from the evaporating section to the condensing sections and then on to the fins of the fin unit 2. At the same time, the airflow that is generated by the cooling fan flows through the flow channels 3 to exchange heat with the fins. The heat is dissipated to the surrounding environment by the airflow. Thus, heat dissipation of the heat-generating electronic device is accomplished.

For enhancing the heat dissipation effectiveness of this heat sink 1, the heat dissipation area of the fin unit 2 needs to be increased. One way to increase the heat dissipation area of the fin unit 2 is to increase the size of each fin. However, this increases the weight and size of the heat sink, which conflicts with the requirement for light weight and compact construction. Another way to increase the heat dissipation area of the fin unit 2 is reducing the spacing distance between neighboring fins, so that the fin unit 2 can accommodate more fins. This may avoid increasing the volume of heat sink 1, however, reducing the spacing between two adjacent fins of the fin unit 2 will increase the flow resistance, which not only influences the heat dissipation effect but also increases the noise. Also, due to the planar shape of each fin of the fin unit 2, a part of the airflow that is generated by the cooling fan escapes from the fin unit 2 around its lateral sides, before the airflow reaches the other side of the fin unit that is opposite to the cooling fan. Thus the degree of heat exchange of the airflow with the fin unit 2 is reduced. Therefore, the airflow flowing through the fin unit cannot sufficiently assist heat dissipation from a heat-generating electronic device. Furthermore, due to the influence of viscosity, a laminar air envelope may form at the surface of the fin unit 2, when the airflow flows through the fin unit 2. The flowing speed of the airflow in this laminar air envelope is nearly zero, whereby the degree of heat exchange between the airflow and the fin unit 2 is further reduced. Accordingly, heat dissipation effectiveness of the conventional heat sink 1 is limited.

What is needed, therefore, is a heat sink having a high heat dissipation effectiveness without increasing the size and the weight of the fin unit.

SUMMARY OF THE INVENTION

According to a preferred embodiment of the present invention, a heat sink includes a fin unit having a plurality of fins parallel to each other. A flow channel is formed between each fin and its neighboring fin to allow an airflow to flow therethough. A protrusion is arranged on each of the fins and defines a through hole therein. The through hole communicates with two neighboring flow channels of the fin for the airflow flowing therethrough from one of the two neighboring flow channels to the other one of two neighboring flow channels of the fin. As a result the airflow can be redistributed when flowing through the protrusion from a first surface of each fin to a second surface opposite to the first surface. This can improve heat exchange of the airflow with the fin unit. Furthermore the protrusions formed on the fins can guide the distribution and flow direction of the airflow whilst simultaneously enhance the turbulence on the surfaces of the fins. Thus the fin unit can have a sufficient heat exchange with the airflow, effectively dissipating the heat of the fin unit that is absorbed from the heat-generating electronic device to the surrounding environment.

Other advantages and novel features of the present invention will be drawn from the following detailed description of the preferred embodiment of the present invention with attached drawings, in which:

BRIEF DESCRIPTION OF THE DRAWINGS

Many aspects of the present heat sink can be better understood with reference to the following drawings. The components in the drawings are not necessarily drawn to scale, the emphasis instead being placed upon clearly illustrating the principles of the present heat sink. Moreover, in the drawings, like reference numerals designate corresponding parts throughout the several views.

DETAILED DESCRIPTION OF THE INVENTION

Figure 1:
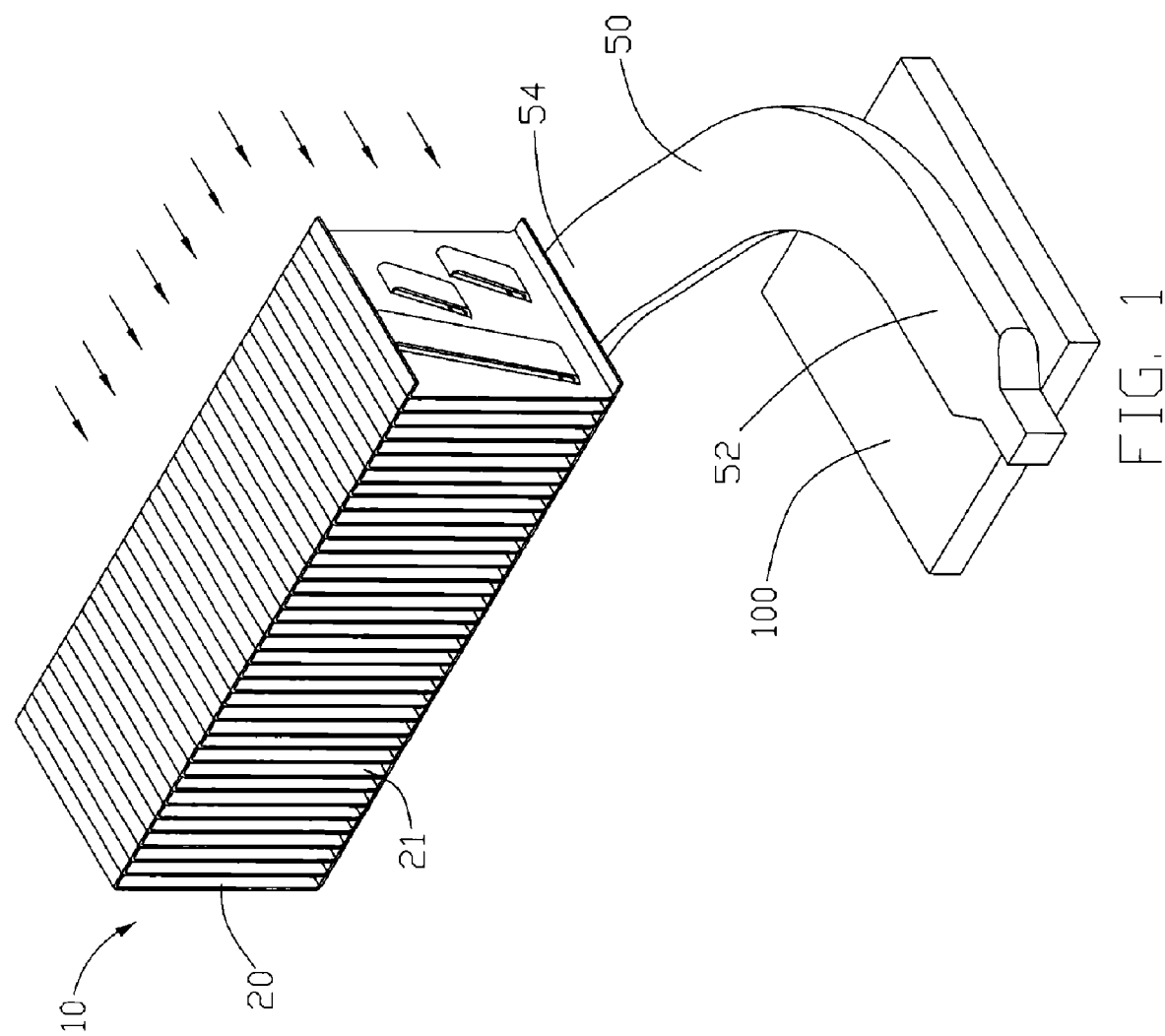
FIG. 1 is an assembled, isometric view of a heat sink arranged on a heat generating component in accordance with a preferred embodiment of the present invention.

Referring to FIG. 1, a heat sink includes a fin unit 10, a heat pipe 50 being thermally attached a heat-generating electronic device, for example, a CPU 100 (central processing unit), to absorb heat therefrom and transfer the heat to the fin unit 10, and a cooling fan (not shown) arranged at a side of the fin unit 10 for generating airflow over the fin unit 10 as indicated by arrows.

Figure 2:
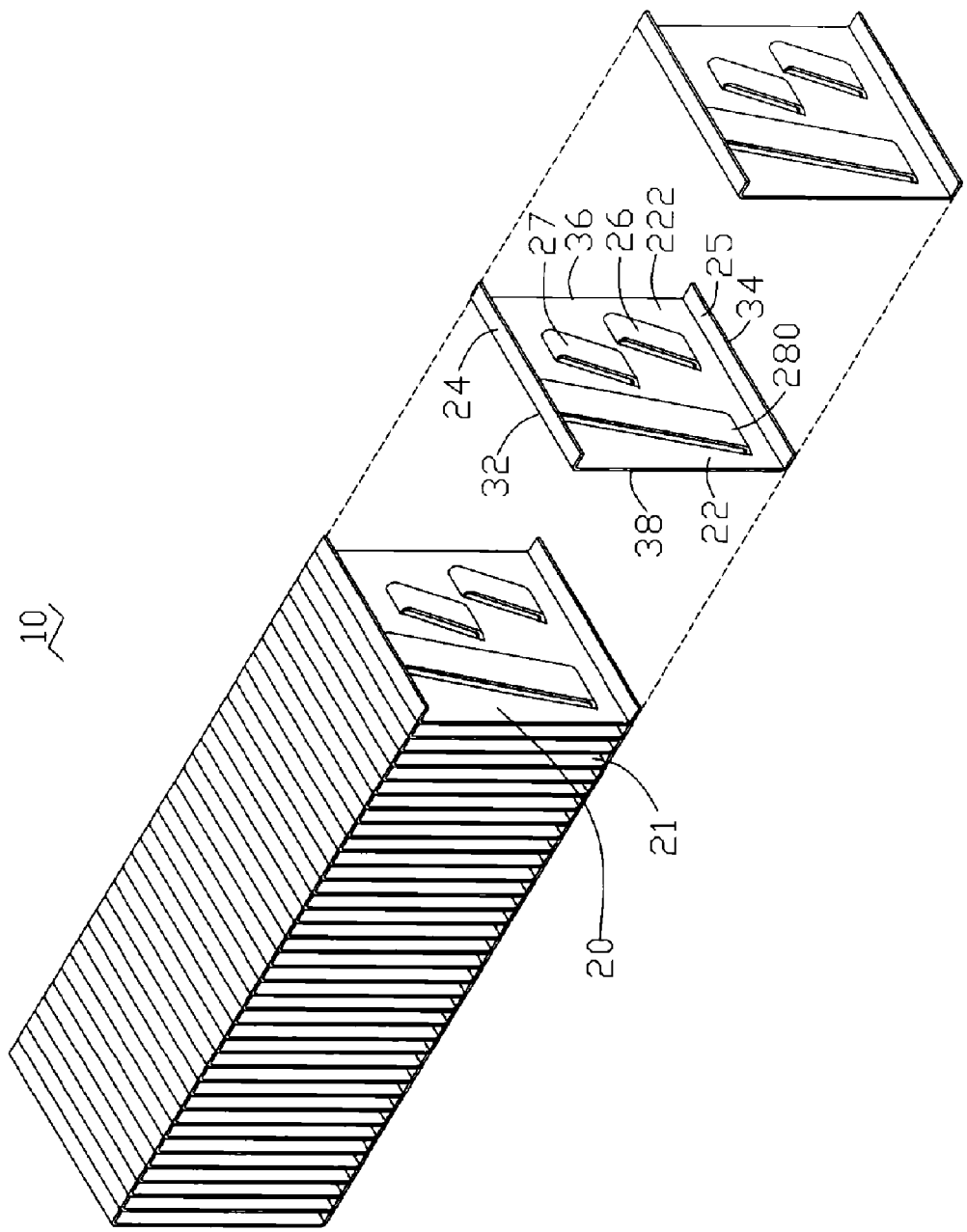
FIG. 2 is an assembled, isometric view of a fin unit of the heat sink of FIG. 1, with some fins of the fin unit being omitted to clearly show structure of the fins.
Figure 3:
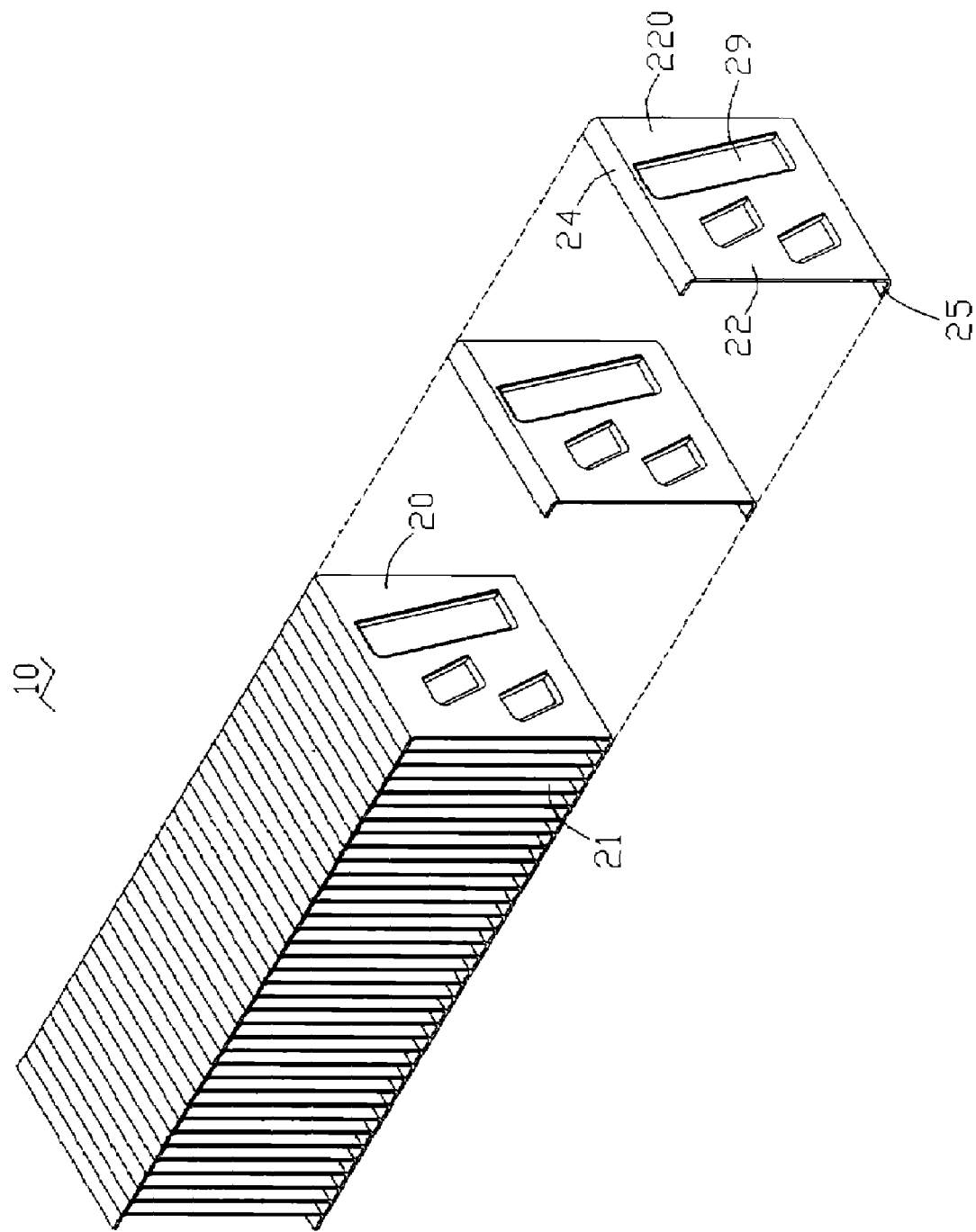
FIG. 3 is a view similar to FIG. 2, from a different aspect.
Figure 4:
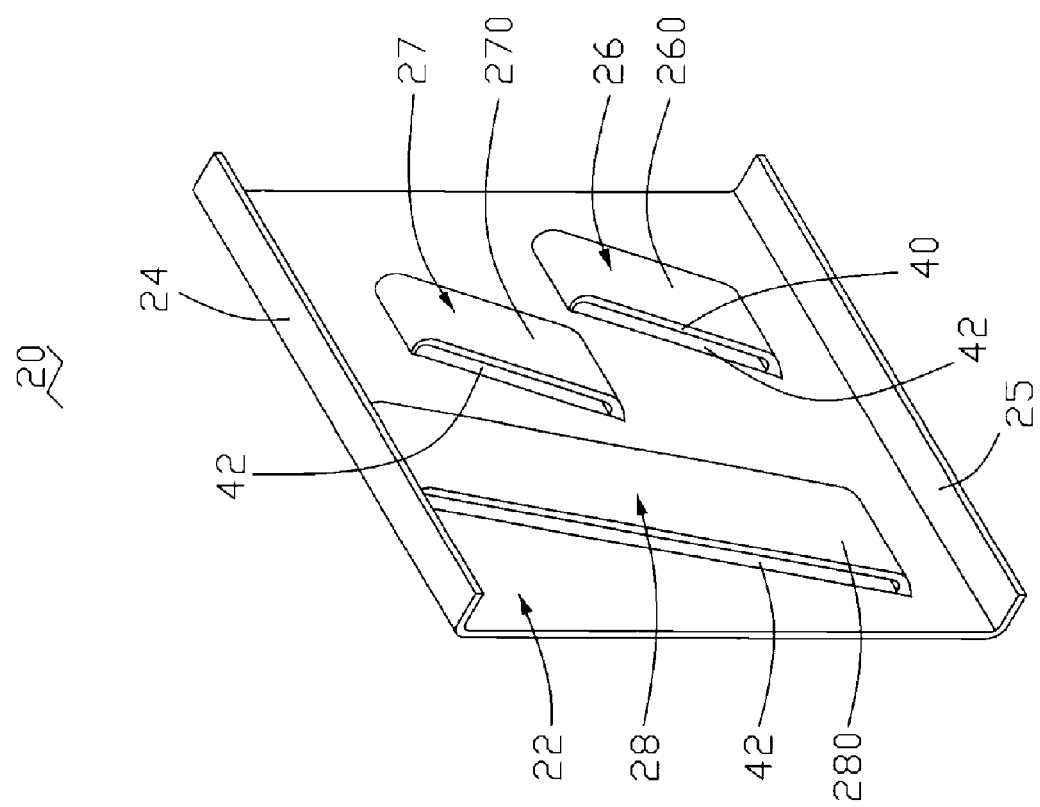
FIG. 4 is an enlarged view of one of the fins of FIG. 2.

Referring to FIGS. 2-3, the fin unit 10 comprises a plurality of stacked fins 20 parallel to each other. A flow channel 21 is formed between each two neighboring fins 20 to channel the airflow. Each fin 20 has a square-shaped main body 22 which includes top and bottom edges 32, 34 extending along the latitudinal direction as the flowing direction of the airflow, and left and right edges 38, 36 extending along the longitudinal direction. Top and bottom hems 24, 25 bend from the top and bottom edges 32, 34 of the main body 22, respectively. Distal edges of the hems 24, 25 of each fin 20 contact with a rear surface 220 of a neighboring fin 20 when the fin unit 10 is assembled, and the height of these hems 24, 25 is thus equal to the distance between the two neighboring fins 20. Then the flow channels 21 formed between the fins 20 are closed along the longitudinal direction by the hems 24, 25, and are open along the latitudinal direction. The airflow flows through the fin unit 10 along the latitudinal direction from the right edge 36 to the left edge 38 of the fin unit 10, and is kept from escaping from the fin unit 10 through the top and bottom edges 32, 34 thereof. Thus the heat exchange between the airflow and the fin unit 10 is improved.

Three protrusions 26, 27, 28, which include in sequence a first protrusion 26, a second protrusion 27 and a third protrusion 28, extend outwardly from a front surface 222 opposite to the rear surface 220 of each fin 20 for guiding airflow along the flowing direction of the airflow. The protrusions 26, 27, 28 are formed by punching or other means, to simplify manufacturing. A concave hole 29 corresponding to each protrusion 26, 27, 28 is formed in the rear surface 220 of the fin 20.

Figure 5:
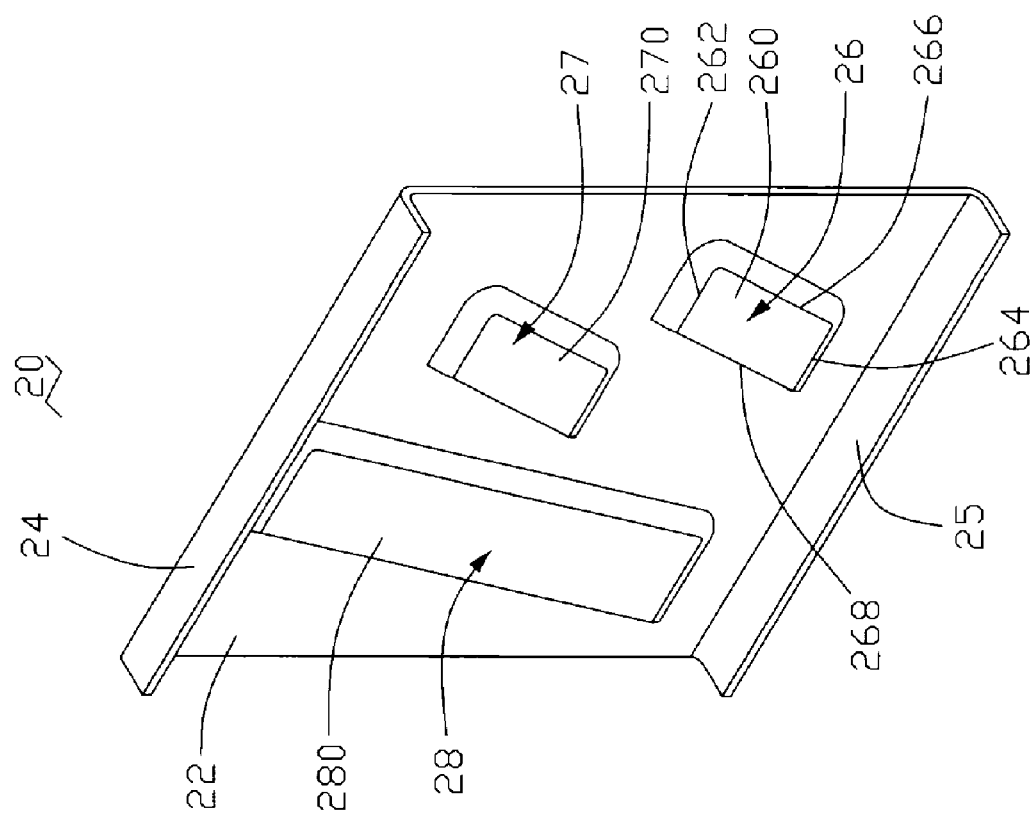
FIG. 5 is similar to FIG. 4, but viewed from a different aspect.

As shown in FIGS. 4-7, the protrusions 26, 27, 28 are strip-shaped and arranged slanted with respect to horizontal. The protrusions 26, 27, 28 each include an outer wall 260, 270, 280 and a sidewall interconnecting the outer wall 260, 270, 280 and the fin 20. As shown in FIG. 5, the outer wall 260 (also the outer wall 270, 280) has parallelogram-like shape. Two opposite sides (i.e., top and bottom sides 262, 264) of the outer wall 260 are approximately parallel to horizontal, whilst the other two opposite sides (i.e., left and right sides 268, 266) of the outer wall 260 extend aslant. The left and right sides 268, 266 of the outer wall 260 extend downwardly and to the left from the top side 262 to the bottom side 264 of the outer wall 260. The protrusions 26, 27, 28 each include a leeward side 40 facing opposite an incoming direction of the airflow and located between the fin 20 and the left side 268 of the outer wall 260, and a windward side 44 which faces the airflow and interconnects the fin 20 and the right side 266 of the outer wall 260. Thus, the windward side 44 and the leeward side 40 are arranged slantwise to the flowing direction of the airflow. An inclined angle θ smaller than 90 degree is defined between each windward side 44 of the protrusions 26, 27, 28 and the bottom hem 25 of the fin 20 as viewed from FIGS. 6-7. Also the three protrusions 26, 27, 28 are arranged slantwise to each other. The inclined angle θ formed between each protrusion 26, 27, 28 and the bottom hem 25 is different from that of the other protrusions 26, 27, 28 and the hem 25 of the fin 20.

A through hole 42 is defined in the leeward side 40 of each protrusion 26, 27, 28. The through hole 42 communicates with two neighboring flow channels 21 of the fin 20. Thus the airflow at the rear surface 220 of each fin 20 can flow through the through holes 42 to the front surface 222 of the fin 20. As a result, a part of the airflow of each flow channel 21 is guided to a neighboring flow channel 21 through the through holes 42 of the protrusions 26, 27, 28. That is, the airflow is redistributed when flowing through the protrusions 26, 27, 28 from the rear surface 220 to the front surface 222 of the fin 20. Thus, the heat exchange effectiveness of the airflow with the fin unit 10 can be improved.

Each protrusion 26, 27, 28 has a size different to that of the other protrusions. The third protrusion 28 which is placed last along the flowing direction has the largest size, the first and second protrusions 26, 27 located ahead the third protrusion 28 has a size smaller than that of the third protrusion 28. The second protrusion 27 is located higher than the first protrusion 26 along the longitudinal direction. A distance is defined between the top side 262 of the first protrusion 26 and the bottom side of the second protrusion 27. Thus the airflow can flow directly to the third protrusion 28. The top side of the third protrusion 28 is higher than that of the second protrusion 27. The bottom side of the third protrusion 28 is not lower than that of the first protrusion 26. A bottom gap 46 is defined between the bottom edge 34 of the fin 20 and the bottom side of the third protrusion 28, and a top gap 48 is defined between the top edge 32 of the fin 20 and the top side of the third protrusion 28. The bottom gap 46 has a width along the longitudinal direction larger than that of the top gap 48.

Also referring to FIG. 1, the heat pipe 50 comprises an evaporating section 52 and a condensing section 54 at two opposite ends thereof. The evaporating section 52 is thermally attached to the CPU 100 to absorb heat generated thereby. The condensing section 54 is thermally attached to the bottom hems 25 of the fin unit 10. The working fluid that is contained in the inner side of the heat pipe 50 absorbs heat and evaporates and moves to the condensing section 54 from the evaporating section 52. Evaporated working fluid is cooled at the condensing section 54 and condensed. Finally, the condensed working fluid flows back to the evaporating section 52 to begin another cycle. In this way, the working fluid absorbs/releases amounts of heat. The heat generated by the CPU 100 is thus transferred from the heat pipe 50 to the fins 20 almost immediately. The heat of the CPU 100 is released to the fin unit 10 effectively and quickly.

Figure 6:
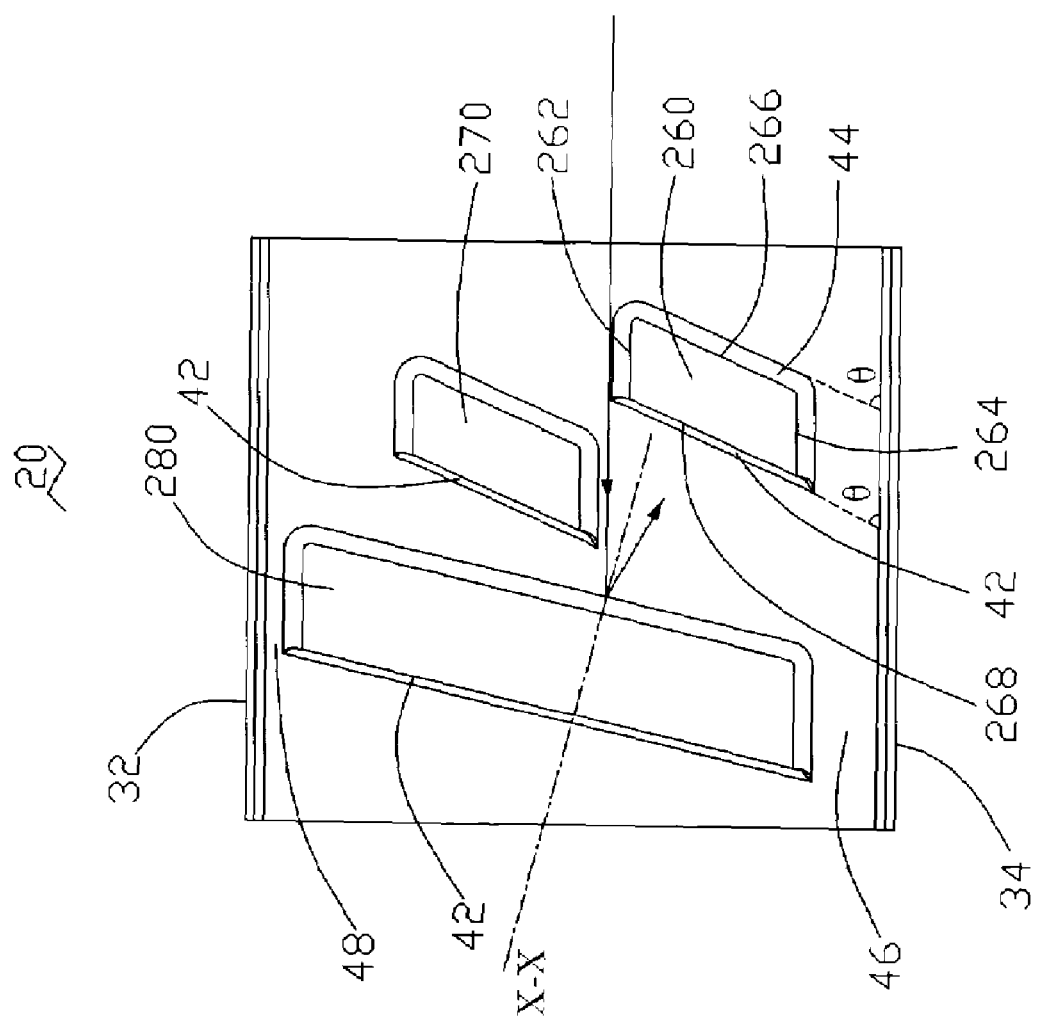
FIG. 6 is a front view of the fin in FIG. 4.
Figure 7:
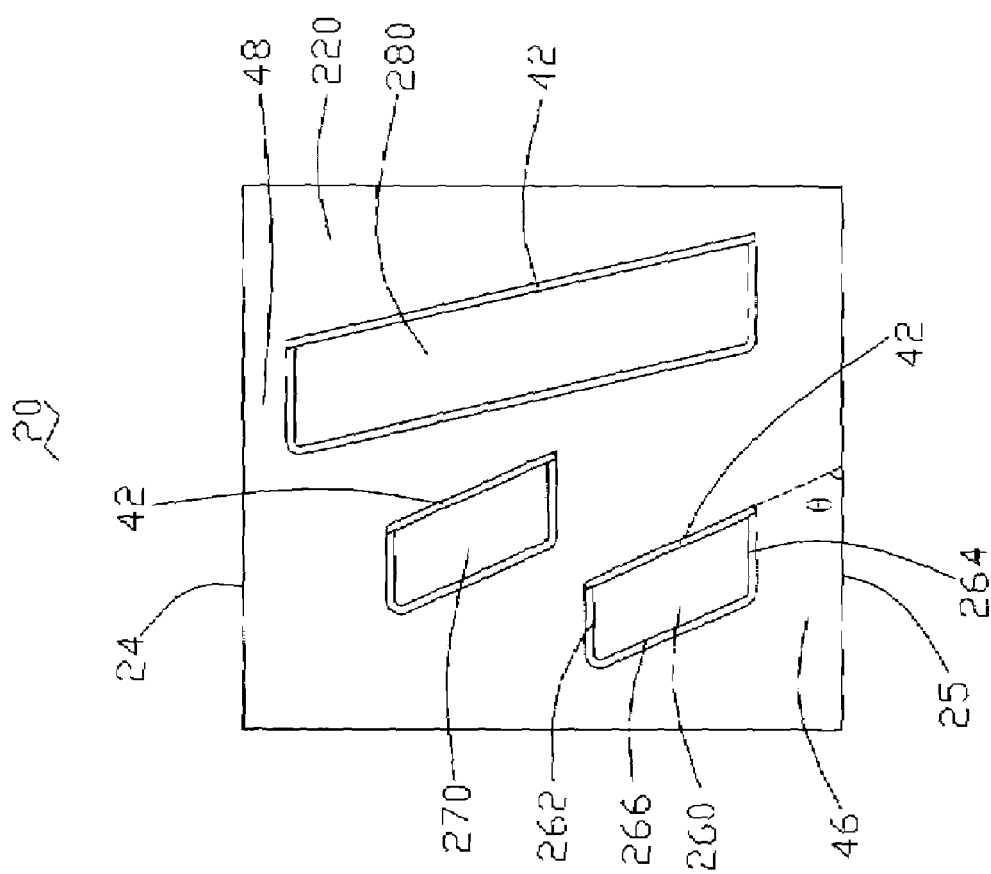
FIG. 7 is a back view of the fin in FIG. 4.

As the fins 20 are likely to have heat resistance, a hot area is form at a lower portion corresponding to the bottom gap 46 of the fin unit 10, where it is adjacent to the heat pipe 50. The temperature in this hot area is higher than the rest of the fins 20. After the forced airflow generated by the fan flows into the flow channels 21, part of the airflow meets the windward sides 44 of the protrusions 26, 27, 28 and thus forms counterflow having a flowing direction opposite to that of the airflow. As the protrusions 26, 27, 28 arranged slantwise to the flowing direction of the airflow, the flowing directions of each counterflow and airflow are symmetric to the normal X-X of the windward side 44 of a corresponding protrusion (as shown in FIG. 6). In other words, the counterflow flows slantwise to the bottom edge 34 to the fin unit 10. Thus the protrusions 26, 27, 28 of the fin unit 10 can cause the airflow to have a counterflow to flow to the hot area of the fin unit 10 near the heat pipe 50. Thus the heat in this hot area can be efficiently carried away by airflow. On the other hand, due to the influence of viscosity, a laminar air envelope will be formed on the surface of the each fin 20 when the airflow passes through the flow channel 21. However, the protrusions 26, 27, 28 acts as a barrier arranged in the flow channel 21, thus a vortex is formed around the protrusions 26, 27, 28 and causes turbulence in the airflow during its flowing process. This turbulence destroys the laminar air envelope formed on the surface of each fin 20. Moreover, through holes 42 are defined in the leeward sides 40 of the protrusions 26, 27, 28, part of the airflow flows through the through holes 42 of the protrusions 26, 27, 28 when flows to the leeward sides 40 of the protrusions 26, 27, 28. The airflow of each flow channel 21 can be guided to a neighboring flow channel 21 through the through holes 42. This enhances the turbulence of the airflow and heat exchange of the airflow with the fins 20. In addition, concave hollows 29 are formed corresponding to the protrusions 26, 27, 28 on the rear surface 220 of each fin 20. The arrangement of these concave hollows 29 causes the rear surface 220 of each fin 20 to be a caved plane. The concave hollows 29 also contribute turbulence of the airflow. Heat exchange between the airflow and the fins 20 is therefore improved. The heat-dissipating efficiency of the heat sink is thus increased.

Figure 8:
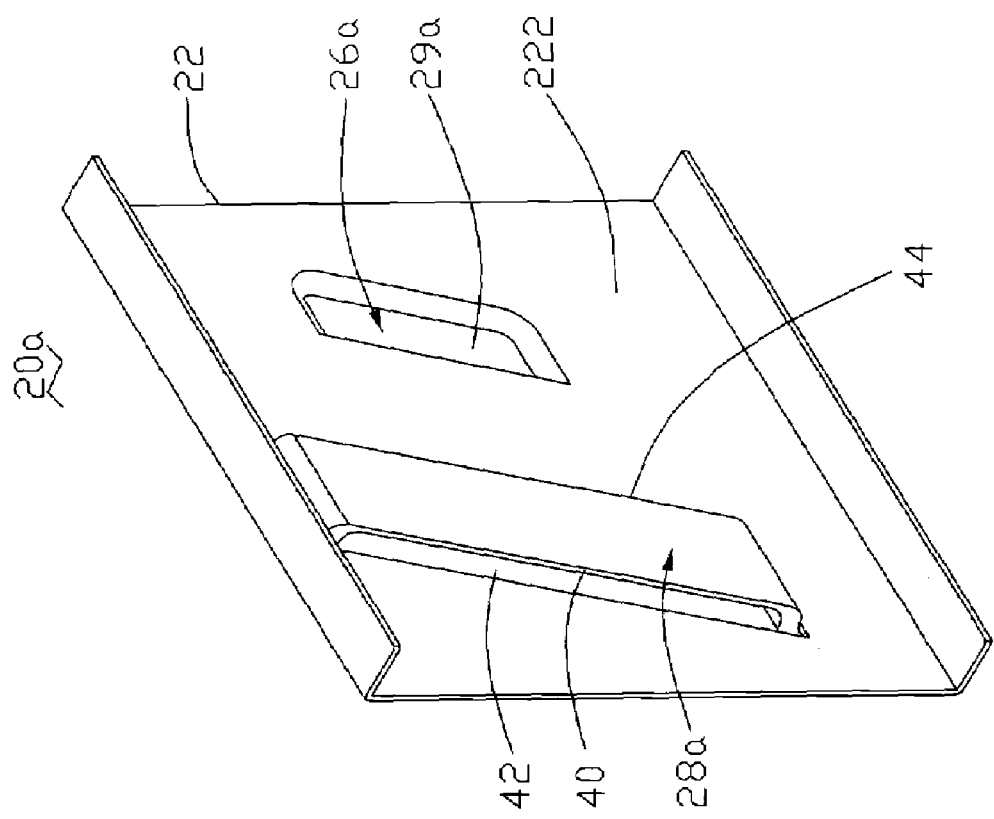
FIG. 8 is an isometric view of a second embodiment of the fin of the fin unit.
Figure 9:
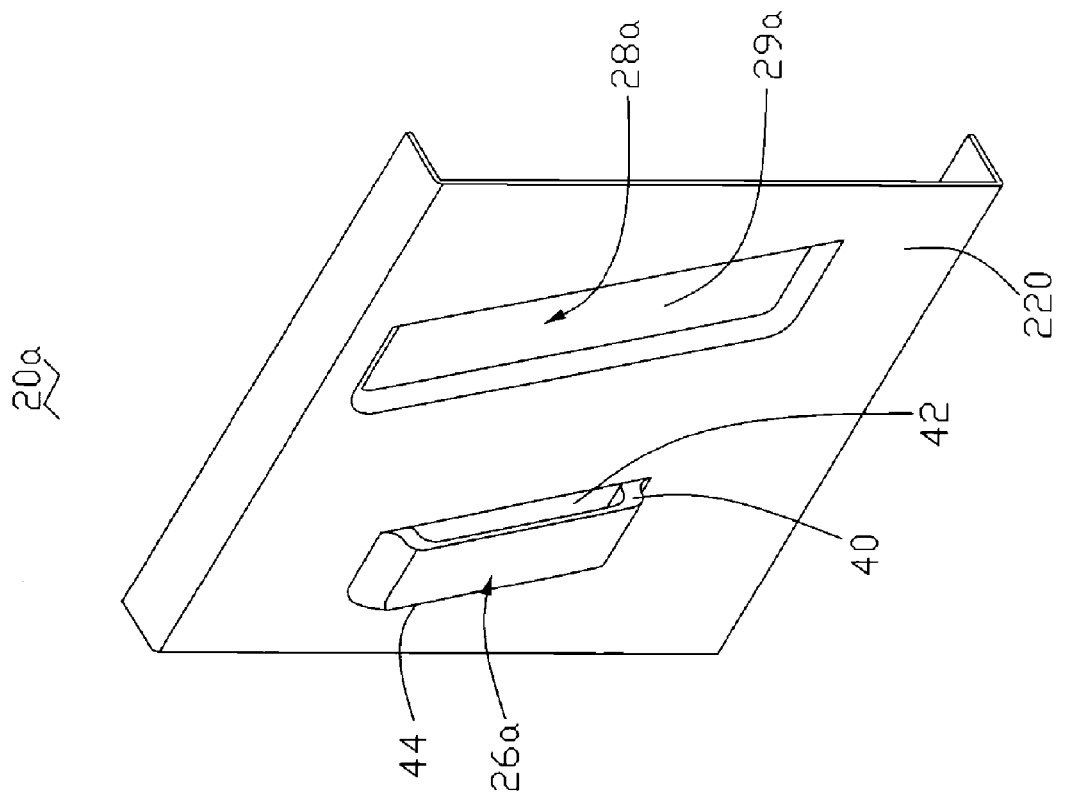
FIG. 9 is a view similar to FIG. 8, from a different aspect.
Figure 10:
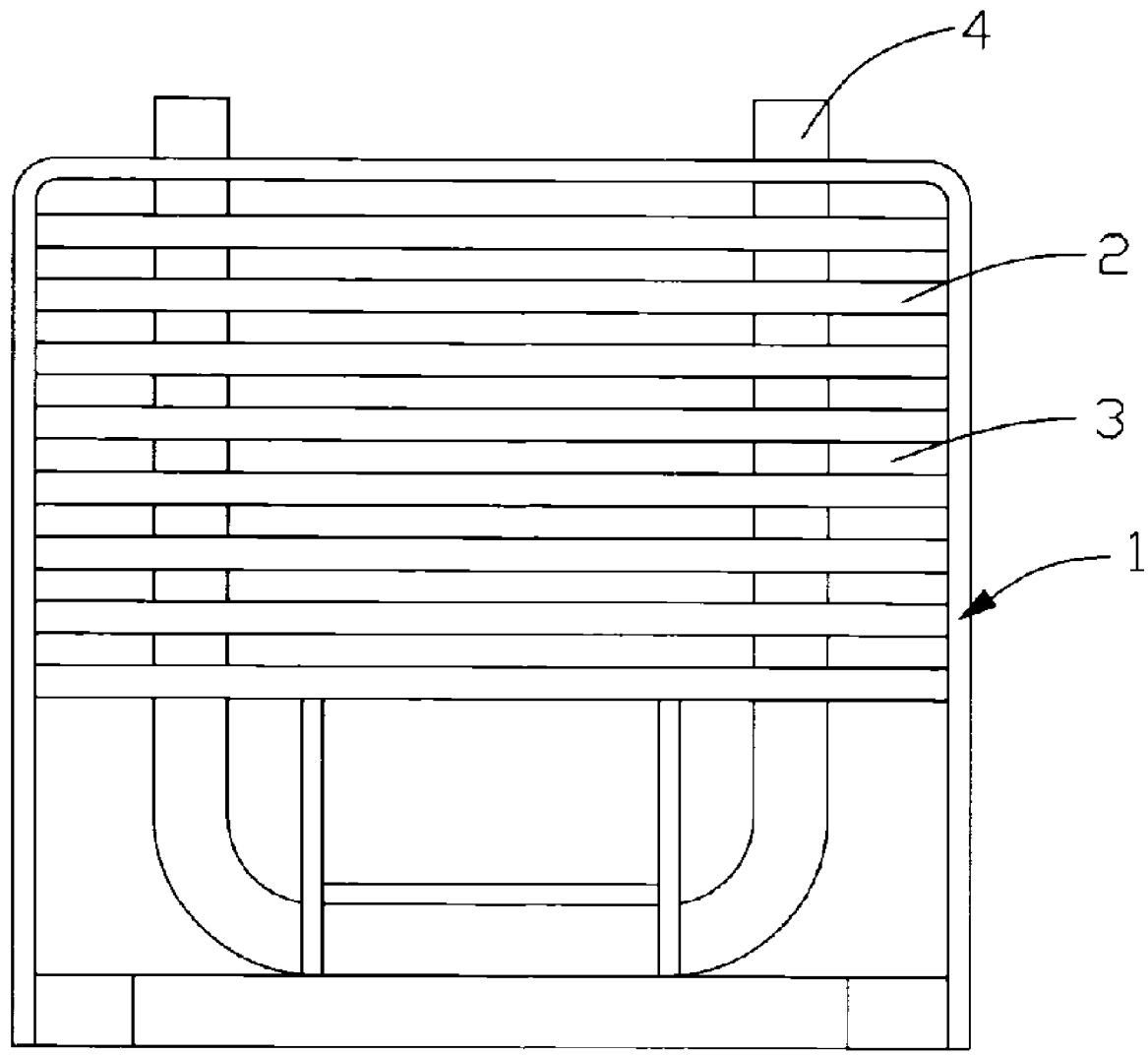
FIG. 10 is a side view of a heat sink in accordance with related art.

FIGS. 8-9 show a second embodiment of the fin 20a. Except for the protrusions 26a, 28a, other parts of the fin 20a in accordance with this second embodiment have substantially the same configuration as the fin 20 of the previous first embodiment. In this embodiment, the fin 20a has a first protrusion 26a and a second protrusion 28a. The two protrusions 26a, 28a are formed on two opposite surfaces of the main body 22 of the fin 20a. The first protrusion 26a extends backward from the rear surface 220 of the main body 22 of the fin 20a, and the second protrusion 28a extends frontward from the front surface 222 of the main body 22 of the fin 20a. Also the protrusions 26a, 28a define through holes 42 in the leeward sides 40 thereof. Concave holes 29a corresponding to the protrusions 26a, 28a are formed in the front surface 222 and the rear surface 220 of the fin 20a, respectively.

While the invention has been described in connection with what is presently considered to be the most practical and preferred embodiment, it is to be understood that the invention is not limited to the disclosed embodiments, but, on the contrary, is intended to accommodate various modifications and equivalent arrangements. The heat sink in accordance with the preferred embodiments of the present invention comprises a plurality of protrusions arranged slantwise to the flowing direction of the airflow. Each of the protrusions is strip-shaped and defines a through hole in the leeward side thereof. Preferably, the number and the shape of these protrusions can be changed according to the heat load of the heat-generating device. There can be more than three protrusions, and the protrusions can be arranged parallel to each other and have the same size. Their shape is not limited to strip shape, dome shape, column shape or other kinds which can destroy the laminar air envelope formed on the surface of each fin and enhance the heat exchange efficiency of the airflow with the fins can also be used.

What is claimed is:

1. A heat sink comprising:
   a fin unit comprising a plurality of fins connected together, each fin defining a first surface and a second surface opposite the first surface, a channel being defined between the first surface and the second surface of two neighboring fins, an airflow flowing through the channel;
   a plurality protrusions formed on the first surface of the each fin, a sidewall interconnecting a windward side and opposite top and bottom sides of each of the protrusions and the each fin, the each of the protrusions defining a through hole at a leeward side of the airflow; and
   a heat pipe having a condensing section thermally connecting with the fin unit and an evaporating section configured for thermally connecting with a heat generating electronic device;
   wherein one of the protrusions located farthest from an inlet of the channel from which the airflow enters the channel has a height larger than that of any other protrusion; and
   wherein the protrusions are slant relative to a bottom edge of the each fin in a direction that tops of the protrusions are located nearer the inlet of the channel from which the airflow enters the channel than bottoms thereof.

2. A heat sink, comprising:
   a flat-type heat pipe having two opposite planar-shaped outer surfaces, the heat pipe comprising an evaporating section configured for thermally connecting with a heat generating electronic device, and a condensing section;
   a fin unit comprising a plurality of fins connected together, each fin comprising a planar-shaped main body and a hem bending from one side of the main body, the hems of the fins thermally attached to the condensing section of the heat pipe, a flow channel formed between main bodies of two neighboring fins for an airflow flowing therethrough;
   a plurality of strip-shaped protrusions formed on the main body of the each fin, each protrusion comprising a sealed windward side facing to the airflow, and a leeward side opposite to the windward side, a through hole being defined in the leeward side of the each protrusion and communicating with two neighboring flow channels of the each fin to allow an airflow to flow therethrough from one of the two neighboring flow channels to the other one of the two neighboring flow channels of the each fin, the windward side of the each protrusion being inclined with respect to the hem of the each fin and guiding the airflow to flow towards the hem of the each fin when the airflow meets the windward side;
   wherein the plurality of protrusions comprise first, second and third protrusions spaced from each other along a flowing direction of the airflow, the first protrusion being adjacent to the hem, the second protrusion is higher than the first protrusion, a space being defined between the first and the second protrusions along a direction perpendicular to the flowing direction of the airflow, a length of the third protrusion being greater than that of each of the first and the second protrusions.

* * * * *